(12) United States Patent
Fagg

(10) Patent No.: US 7,834,482 B2
(45) Date of Patent: Nov. 16, 2010

(54) APPARATUS AND METHOD FOR GENERATING FINE TIMING FROM COARSE TIMING SOURCE

(75) Inventor: Russell John Fagg, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 495 days.

(21) Appl. No.: 11/739,004

(22) Filed: Apr. 23, 2007

(65) Prior Publication Data

US 2008/0258562 A1 Oct. 23, 2008

(51) Int. Cl.
*H03K 3/64* (2006.01)
(52) U.S. Cl. ........................ 307/106; 333/176
(58) Field of Classification Search .......... 307/106; 333/20, 178
See application file for complete search history.

(56) References Cited

U.S. PATENT DOCUMENTS

| | | | | |
|---|---|---|---|---|
| 3,569,677 A | * | 3/1971 | Bray et al. | 377/39 |
| 3,906,247 A | | 9/1975 | Heffner | |
| 3,916,120 A | * | 10/1975 | Morris | 370/243 |
| 4,164,926 A | * | 8/1979 | Kindlmann | 123/406.59 |
| 4,316,178 A | * | 2/1982 | Shibayama et al. | 341/118 |
| 5,124,597 A | | 6/1992 | Stuebing | |
| 5,687,169 A | | 11/1997 | Fullerton | |
| 5,764,696 A | | 6/1998 | Barnes et al. | |
| 5,812,081 A | | 9/1998 | Fullerton | |
| 5,832,035 A | | 11/1998 | Fullerton | |
| 5,907,427 A | | 5/1999 | Scalora et al. | |
| 5,952,956 A | | 9/1999 | Fullerton | |
| 5,960,031 A | | 9/1999 | Fullerton et al. | |
| 5,963,581 A | | 10/1999 | Fullerton et al. | |
| 5,969,663 A | | 10/1999 | Fullerton et al. | |
| 5,995,534 A | | 11/1999 | Fullerton et al. | |
| 6,031,862 A | | 2/2000 | Fullerton et al. | |
| 6,091,374 A | | 7/2000 | Barnes | |

(Continued)

FOREIGN PATENT DOCUMENTS

EP 0487177 A1 5/1992

(Continued)

OTHER PUBLICATIONS

International Search Report and Written Opinion - PCT/US2008/051439 - International Search Authority, European Patent Office - Jan. 27, 2009 (061056).

(Continued)

*Primary Examiner*—Albert W Paladini
(74) *Attorney, Agent, or Firm*—Dang M. Vo

(57) ABSTRACT

An apparatus for generating a pulse at a particular time dictated by an input. The apparatus may comprise an offset voltage generator for generating an offset voltage that is a function of the input, a current generator for generating a current, a ramp voltage generator for generating a ramp voltage having an initial value as a function of the offset voltage and a slope as a function of the current, and a pulse generator for generating a pulse in response to the ramp voltage reaching a threshold voltage. With this configuration, the time the pulse is generated is controlled by the input. This may be used in transceivers to control the time of transmission and the time of reception. Such times may be used to set up communication channels, such as ultra-wide band (UWB) channels, for communicating with other devices.

46 Claims, 11 Drawing Sheets

U.S. PATENT DOCUMENTS

| | | | |
|---|---|---|---|
| 6,108,376 | A | 8/2000 | Morgan et al. |
| 6,111,536 | A | 8/2000 | Richards et al. |
| 6,133,876 | A | 10/2000 | Fullerton et al. |
| 6,177,903 | B1 | 1/2001 | Fullerton et al. |
| 6,218,979 | B1 | 4/2001 | Barnes et al. |
| 6,295,019 | B1 | 9/2001 | Richards et al. |
| 6,297,773 | B1 | 10/2001 | Fullerton et al. |
| 6,300,903 | B1 | 10/2001 | Richards et al. |
| 6,304,623 | B1 | 10/2001 | Richards et al. |
| 6,351,652 | B1 | 2/2002 | Finn et al. |
| 6,354,946 | B1 | 3/2002 | Finn |
| 6,400,307 | B2 | 6/2002 | Fullerton et al. |
| 6,400,329 | B1 | 6/2002 | Barnes |
| 6,421,389 | B1 | 7/2002 | Jett et al. |
| 6,430,208 | B1 | 8/2002 | Fullerton et al. |
| 6,437,756 | B1 | 8/2002 | Schantz |
| 6,462,701 | B1 | 10/2002 | Finn |
| 6,466,125 | B1 | 10/2002 | Richards et al. |
| 6,469,628 | B1 | 10/2002 | Richards et al. |
| 6,483,461 | B1 | 11/2002 | Matheney et al. |
| 6,489,893 | B1 | 12/2002 | Richards et al. |
| 6,492,904 | B2 | 12/2002 | Richards |
| 6,492,906 | B1 | 12/2002 | Richards et al. |
| 6,501,393 | B1 | 12/2002 | Richards et al. |
| 6,504,483 | B1 | 1/2003 | Richards et al. |
| 6,512,455 | B2 | 1/2003 | Finn et al. |
| 6,512,488 | B1 | 1/2003 | Schantz |
| 6,519,464 | B1 | 2/2003 | Santhoff et al. |
| 6,529,568 | B1 | 3/2003 | Richards et al. |
| 6,538,615 | B1 | 3/2003 | Schantz |
| 6,539,213 | B1 | 3/2003 | Richards et al. |
| 6,549,567 | B1 | 4/2003 | Fullerton |
| 6,552,677 | B2 | 4/2003 | Barnes et al. |
| 6,556,621 | B1 | 4/2003 | Richards et al. |
| 6,560,463 | B1 | 5/2003 | Santhoff |
| 6,571,089 | B1 | 5/2003 | Richards et al. |
| 6,573,857 | B2 | 6/2003 | Fullerton et al. |
| 6,577,691 | B2 | 6/2003 | Richards et al. |
| 6,585,597 | B2 | 7/2003 | Finn |
| 6,593,886 | B2 | 7/2003 | Schantz |
| 6,606,051 | B1 | 8/2003 | Fullerton et al. |
| 6,611,234 | B2 | 8/2003 | Fullerton et al. |
| 6,614,384 | B2 | 9/2003 | Hall et al. |
| 6,621,462 | B2 | 9/2003 | Barnes |
| 6,636,566 | B1 | 10/2003 | Roberts et al. |
| 6,636,567 | B1 | 10/2003 | Roberts et al. |
| 6,636,573 | B2 | 10/2003 | Richards et al. |
| 6,642,903 | B2 | 11/2003 | Schantz |
| 6,661,342 | B2 | 12/2003 | Hall et al. |
| 6,667,724 | B2 | 12/2003 | Barnes et al. |
| 6,670,909 | B2 | 12/2003 | Kim |
| 6,671,310 | B1 | 12/2003 | Richards et al. |
| 6,674,396 | B2 | 1/2004 | Richards et al. |
| 6,677,796 | B2 | 1/2004 | Brethour et al. |
| 6,700,538 | B1 | 3/2004 | Richards |
| 6,710,736 | B2 | 3/2004 | Fullerton et al. |
| 6,717,992 | B2 | 4/2004 | Cowie et al. |
| 6,748,040 | B1 | 6/2004 | Johnson et al. |
| 6,750,757 | B1 | 6/2004 | Gabig, Jr. et al. |
| 6,759,948 | B2 | 7/2004 | Grisham et al. |
| 6,760,387 | B2 | 7/2004 | Langford et al. |
| 6,762,712 | B2 | 7/2004 | Kim |
| 6,763,057 | B1 | 7/2004 | Fullerton et al. |
| 6,763,282 | B2 | 7/2004 | Glenn et al. |
| 6,774,846 | B2 | 8/2004 | Fullerton et al. |
| 6,774,859 | B2 | 8/2004 | Schantz et al. |
| 6,778,603 | B1 | 8/2004 | Fullerton et al. |
| 6,781,530 | B2 | 8/2004 | Moore |
| 6,782,048 | B2 | 8/2004 | Santhoff |
| 6,788,730 | B1 | 9/2004 | Richards et al. |
| 6,822,604 | B2 | 11/2004 | Hall et al. |
| 6,823,022 | B1 | 11/2004 | Fullerton et al. |
| 6,836,223 | B2 | 12/2004 | Moore |
| 6,836,226 | B2 | 12/2004 | Moore |
| 6,845,253 | B1 | 1/2005 | Schantz |
| 6,847,675 | B2 | 1/2005 | Fullerton et al. |
| 6,879,878 | B2 | 4/2005 | Glenn et al. |
| 6,882,301 | B2 | 4/2005 | Fullerton |
| 6,895,034 | B2 | 5/2005 | Nunally et al. |
| 6,900,732 | B2 | 5/2005 | Richards |
| 6,906,625 | B1 | 6/2005 | Taylor et al. |
| 6,907,244 | B2 | 6/2005 | Santhoff et al. |
| 6,912,240 | B2 | 6/2005 | Kumar et al. |
| 6,914,949 | B2 | 7/2005 | Richards et al. |
| 6,917,284 | B2 | 7/2005 | Grisham et al. |
| 6,919,838 | B2 | 7/2005 | Santhoff |
| 6,922,166 | B2 | 7/2005 | Richards et al. |
| 6,922,177 | B2 | 7/2005 | Barnes et al. |
| 6,925,109 | B2 | 8/2005 | Richards et al. |
| 6,933,882 | B2 | 8/2005 | Fullerton |
| 6,937,639 | B2 | 8/2005 | Pendergrass et al. |
| 6,937,663 | B2 | 8/2005 | Jett et al. |
| 6,937,667 | B1 | 8/2005 | Fullerton et al. |
| 6,937,674 | B2 | 8/2005 | Santhoff et al. |
| 6,947,492 | B2 | 9/2005 | Santhoff et al. |
| 6,950,485 | B2 | 9/2005 | Richards et al. |
| 6,954,480 | B2 | 10/2005 | Richards et al. |
| 6,959,031 | B2 | 10/2005 | Haynes et al. |
| 6,959,032 | B1 | 10/2005 | Richards et al. |
| 6,963,727 | B2 | 11/2005 | Shreve |
| 6,980,613 | B2 | 12/2005 | Krivokapic |
| 6,989,751 | B2 | 1/2006 | Richards |
| 7,015,793 | B2 | 3/2006 | Gabig, Jr. et al. |
| 7,020,224 | B2 | 3/2006 | Krivokapic |
| 7,027,425 | B1 | 4/2006 | Fullerton et al. |
| 7,027,483 | B2 | 4/2006 | Santhoff et al. |
| 7,027,493 | B2 | 4/2006 | Richards |
| 7,030,806 | B2 | 4/2006 | Fullerton |
| 7,042,417 | B2 | 5/2006 | Santhoff et al. |
| 7,046,187 | B2 | 5/2006 | Fullerton et al. |
| 7,046,618 | B2 | 5/2006 | Santhoff et al. |
| 7,069,111 | B2 | 6/2006 | Glenn et al. |
| 7,075,476 | B2 | 7/2006 | Kim |
| 7,079,827 | B2 | 7/2006 | Richards et al. |
| 7,099,367 | B2 | 8/2006 | Richards et al. |
| 7,099,368 | B2 | 8/2006 | Santhoff et al. |
| 7,129,886 | B2 | 10/2006 | Hall et al. |
| 7,132,975 | B2 | 11/2006 | Fullerton et al. |
| 7,145,954 | B1 | 12/2006 | Pendergrass et al. |
| 7,148,791 | B2 | 12/2006 | Grisham et al. |
| 7,151,490 | B2 | 12/2006 | Richards |
| 7,167,525 | B2 | 1/2007 | Santhoff et al. |
| 7,170,408 | B2 | 1/2007 | Taylor et al. |
| 7,184,938 | B1 | 2/2007 | Lansford et al. |
| 7,190,722 | B2 | 3/2007 | Lakkis et al. |
| 7,190,729 | B2 | 3/2007 | Siwiak |
| 7,206,334 | B2 | 4/2007 | Siwiak |
| 7,209,724 | B2 | 4/2007 | Richards et al. |
| 7,230,980 | B2 | 6/2007 | Langford et al. |
| 7,239,277 | B2 | 7/2007 | Fullerton et al. |
| RE39,759 | E | 8/2007 | Fullerton |
| 7,256,727 | B2 | 8/2007 | Fullerton et al. |
| 7,271,779 | B2 | 9/2007 | Hertel |

OTHER PUBLICATIONS

Lovely D.F et al., "Micro power pulse-position modulator for time-shared applications" Medical and Biological Engineering and Computing, Springer, Heidelberg, DE. vol. 24, No. 5, Sep. 1, 1986 pp. 531-535, XP001630800, ISSN: 0140-0118.

* cited by examiner

APPARATUS AND METHOD FOR GENERATING FINE TIMING FROM COARSE TIMING SOURCE

FIELD

This application relates generally to apparatus and method for generating fine timing (e.g., a pulse) from a coarse timing source such as a periodic clock.

BACKGROUND

Previous communication systems use techniques that are typically power inefficient. These systems typically employ transmitters and receivers that require continuous power even during times when they are not transmitting or receiving communications. Such systems that remain idle while consuming power are generally inefficient from a power perspective.

In some applications, such power inefficient communication systems may present limitation as to their extended use. For example, portable communication devices that rely on battery power generally have a relatively short continuous operational lifespan before their batteries need to be replaced or recharged. In some situations, this may result in adverse consequences, such as data loss, communication delays, dropped sessions and down time.

On the other hand, communication systems that consume substantially lower power during idle times are generally able to operate for longer periods with a limited power source. Thus, communication systems that power on a transmitter only when the signal is to be transmitted will generally consume less power than a transmitter that is continuously powered. Similarly, communication systems that power on a receiver only when the signal is to be received will generally consume less power than a receiver that is continuously powered.

SUMMARY

A summary of sample aspects of the disclosure follows. For convenience, one or more aspects of the disclosure may be referred to herein simply as "some aspects."

Some aspects of the disclosure relate to an apparatus for generating a pulse based on an input. The apparatus comprises a first generator for generating an offset voltage as a function of the input, a second generator for generating a current, a third generator for generating a ramp voltage having an initial value as a function of the offset voltage and a slope as a function of the current, and a fourth generator for generating a pulse in response to the ramp voltage reaching a threshold voltage.

If the input dictates an offset voltage that is closer to the threshold voltage, the ramp voltage reaches the threshold voltage in a relatively short time interval, resulting in the pulse being generated relatively early. If, on the other hand, the input dictates an offset voltage that is farther from the threshold voltage, the ramp voltage reaches the threshold voltage in a relatively long time interval, resulting in the pulse being generated relatively late. Thus, the time the pulse is generated is controlled by the input. This may be used to enable transmitters and receivers for the duration of the pulse to control the times of transmission and reception of signals. Such times may be used to establish communication channels for communicating with other devices.

In some aspects, the initial value of the ramp voltage may be substantially the same as the offset voltage or related thereto. The offset voltage may be generated by a digital-to-analog converter (DAC). A calibration circuit may be employed to calibrate the offset voltage to correlate the input with the generation of the pulse. More specifically, the calibration circuit may determine a digital input word for the DAC that corresponds to the upper limit of the offset voltage, e.g., the threshold voltage of the pulse generator. The digital input word for the DAC corresponding to the lower limit of the offset voltage of the DAC may be predefined. The input word for the DAC corresponding to offset voltages between the upper and lower limits may be determined by interpolation.

In some aspects, the current, as well as the slope of the ramp voltage, may be positive, negative, linear or non-linear. The current may be generated by a current mode digital-to-analog converter (DAC). A calibration circuit may be employed to calibrate the current to correlate the input with the generation of the pulse. More specifically, with the offset voltage set to its lower limit, the current calibration circuit determines a current that results in the ramp voltage reaching the threshold voltage at the upper time limit for the generation of the pulse. A periodic clock source may be used to define the interval in which the pulse is to be generated.

In some aspects, the apparatus may be configured as or used in a communication device to establish, for example, one or more ultra-wide band (UWB) channels for communicating with other devices using pulse division multiple access (PDMA) techniques. A UWB channel may have a fractional bandwidth on the order of 20% or more, a bandwidth on the order of 500 MHz or more, or both.

In some aspects, the apparatus may be implemented as or used in a headset, medical device, microphone, biometric sensor, heart rate monitor, pedometer, EKG device, user I/O device, watch, remote control, switch, tire pressure monitor, entertainment device, computer, point-of-sale device, hearing aid, set-top box, cell phone, or a device with some form of wireless signaling capability. In some aspects, the apparatus may be implemented in or comprise an access device (e.g., a WiFi access point) for a communication system. For example, the apparatus may provide connectivity to another network (e.g., a wide area network such as the Internet) via a wired or wireless communication link.

Other aspects, advantages and novel features of the present disclosure will become apparent from the following detailed description of the disclosure when considered in conjunction with the accompanying drawings.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As an example of some of the above concepts, in some aspects, an apparatus for generating a pulse comprises a generator for generating an offset voltage as a function of an input; a generator for generating a current; a generator for generating a ramp voltage having an initial value as a function of the offset voltage and a slope as a function of the current; and a generator for generating a pulse in response to the ramp voltage reaching a threshold voltage. In other aspects, the apparatus comprises a generator for generating a ramp voltage as a function of an input; and a generator for generating a timing event when the ramp voltage reaches a threshold voltage.

Figure 1A:
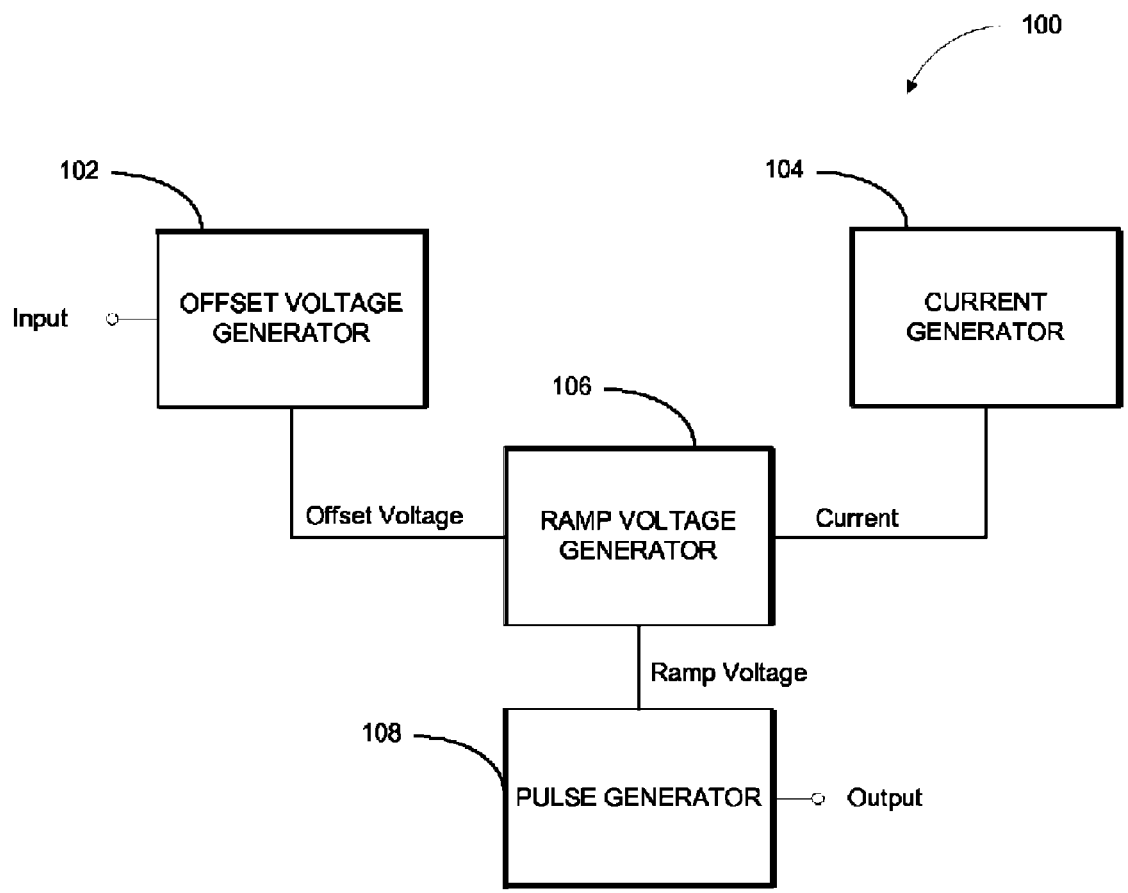
FIG. 1A-B illustrate respective block diagrams of exemplary apparatus for generating a pulse in accordance with some aspects of the disclosure.

FIG. 1A illustrates a block diagram of an exemplary apparatus 100 for generating a pulse in accordance with some aspects of the disclosure. It shall be understood that the apparatus 100 is merely one example of a timing event generator. The apparatus 100 generates a pulse at a particular time dictated by a pulse position input. As discussed in more detail below, the apparatus 100 may be used to enable a transmitter to transmit a signal and/or a receiver to receive a signal. In this manner, one or more communication channels may be established by pulse modulation techniques, such as pulse division multiple access (PDMA).

In summary, the apparatus 100 generates a ramp voltage that includes an initial offset voltage as a function of an input and a slope as a function of a current. When the ramp voltage reaches a threshold voltage, the apparatus 100 generates the pulse. By varying the offset voltage as a function of the input, the ramp voltage reaches the threshold voltage at different times. Thus, the time of the generation of the pulse can be controlled by the input.

More specifically, the apparatus 100 comprises an offset voltage generator 102, a current generator 104, a ramp voltage generator 106, and a pulse generator 108. The offset voltage generator 102 receives an input, such as a digital word, and generates a corresponding offset voltage. The current generator 104 generates a current that may be substantially constant, may vary linearly with time, or may vary non-linearly with time. In some aspects, the current may flow from the current generator 104 to the ramp voltage generator 106. In some other aspects, the current may flow from the ramp voltage generator 106 to the current generator 104.

The ramp voltage generator 106 generates a ramp voltage from the offset voltage received from the offset voltage generator 102 and the current received from the current generator 104. In some aspects, the ramp voltage generator 106 uses the offset voltage to set an initial value for the ramp voltage. In some aspects, the ramp voltage generator 106 uses the current to control the slope of the ramp voltage. As an example, the ramp voltage generator 106 integrates the current to generate the ramp voltage.

The pulse generator 108 generates a pulse when the ramp voltage reaches a predefined threshold voltage. As discussed, the input sets the offset voltage, which is the initial value of the ramp voltage. Thus, by varying the offset voltage, the ramp voltage reaches the threshold voltage at different times dependent on the input. Thus, the timing of the generation of the pulse is controlled by the input. This is better explained with reference to the following examples.

Figure 2A:
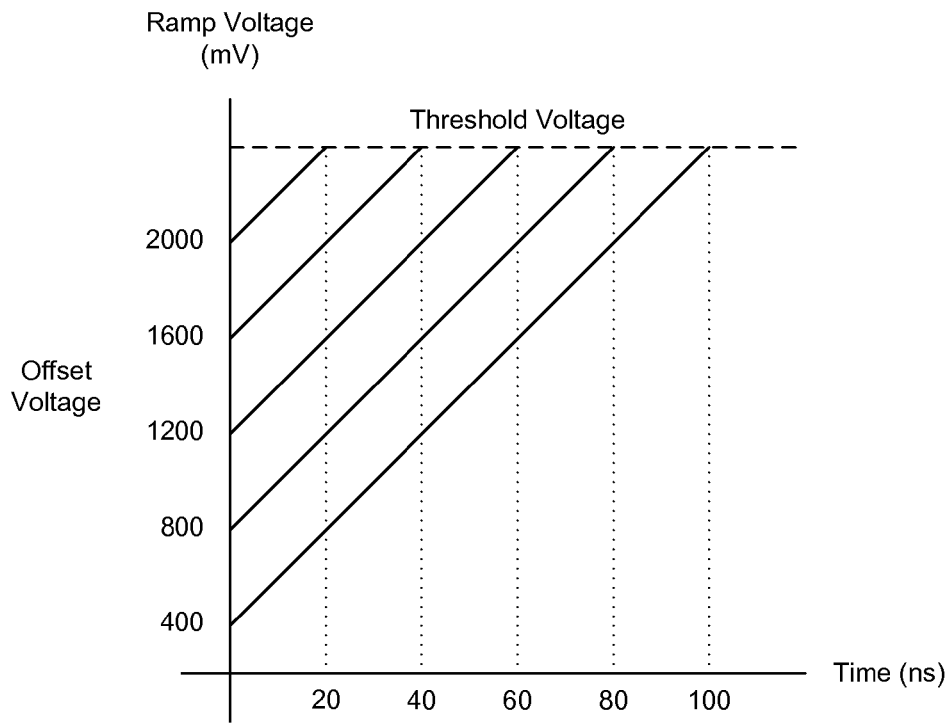
FIG. 2A illustrates a graph of exemplary signals generated by the exemplary apparatus for generating a pulse in accordance with some aspects of the disclosure.

FIG. 2A illustrates a graph of exemplary signals generated by the exemplary apparatus 100 in accordance with some aspects of the disclosure. In this example, the current generated by the current generator 104 is substantially constant and flows from the current generator 104 to the ramp voltage generator 106. The vertical axis of the graph represents the ramp voltage and the horizontal axis represents time. A threshold voltage is shown near the top of the graph. As discussed above, when the ramp voltage reaches the threshold voltage, the pulse generator 108 generates a pulse.

As the graph illustrates, the time the ramp reaches the threshold is dependent on the offset voltage. For example, if, based on the input, the offset voltage generator 102 generates an offset voltage of 400 milli-Volts (mV), the ramp voltage reaches the threshold at a time of 100 nanoseconds (ns). As another example, if, based on the input, the offset voltage generator 102 generates an offset voltage of 1200 mV, the ramp voltage reaches the threshold at a time of 60 nanoseconds (ns). As still another example, if, based on the input, the offset voltage generator 102 generates an offset voltage of 2000 mV, the ramp voltage reaches the threshold at a time of 20 nanoseconds (ns). Thus, the input controls the time within the 100 ns interval at which the pulse is generated.

Figure 2B:
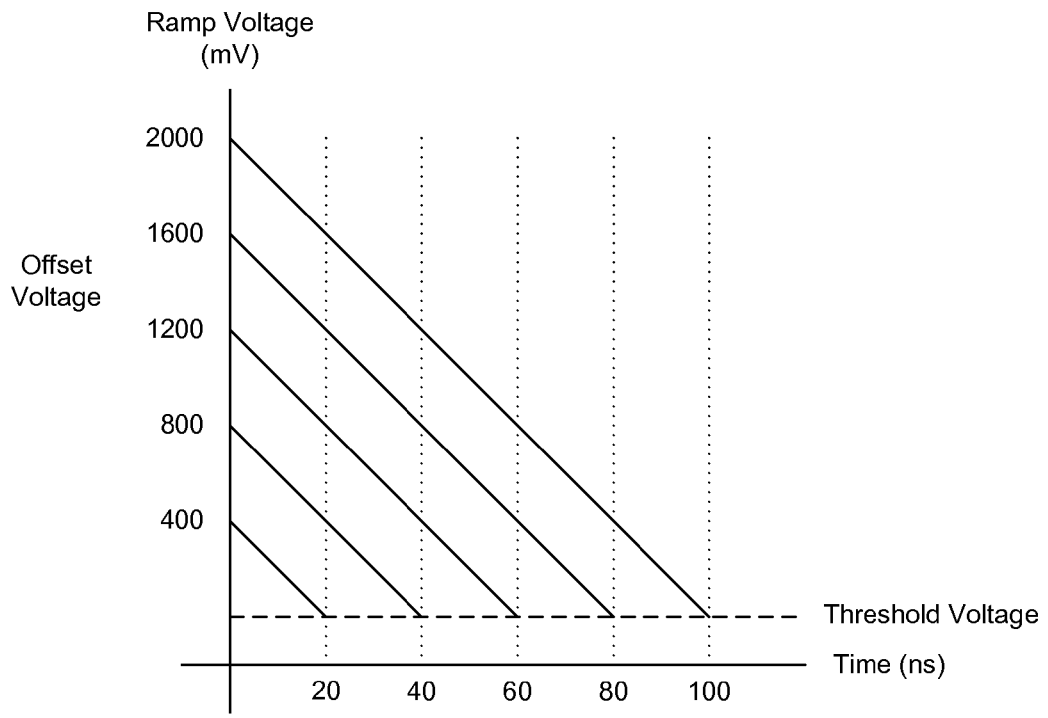
FIG. 2B illustrates a graph of exemplary signals generated by the exemplary apparatus for generating a pulse in accordance with some aspects of the disclosure.

FIG. 2B illustrates a graph of exemplary signals generated by the exemplary apparatus 100 in accordance with some aspects of the disclosure. In this example, the current generated by the current generator 104 is substantially constant and flows from the ramp voltage generator 106 to the current generator 104. Again, the vertical axis of the graph represents the ramp voltage and the horizontal axis represents time. A threshold voltage is shown near the bottom of the graph. As discussed above, when the ramp voltage reaches the threshold, the pulse generator 108 generates a pulse.

As the graph illustrates, the time the ramp reaches the threshold is dependent on the offset voltage. For example, if, based on the input, the offset voltage generator 102 generates an offset voltage of 200 mV, the ramp voltage reaches the threshold at a time of 100 nanoseconds (ns). As another example, if, based on the input, the offset voltage generator 102 generates an offset voltage of 1200 mV, the ramp voltage reaches the threshold at a time of 60 nanoseconds (ns). As still another example, if, based on the input, the offset voltage generator 102 generates an offset voltage of 400 mV, the ramp voltage reaches the threshold at a time of 20 nanoseconds (ns). Thus, the input controls the time within the 100 ns interval at which the pulse is generated.

In the prior examples, the input controls when the pulse is generated within a time interval. In this example, the time interval is 100 ns. It shall be understood that the time interval may be of different time lengths. Additionally, the time interval may be consecutively repeated in response to a substantially constant frequency clock source. For example, a 10 MHz clock may be used to repeatedly initiate the 100 ns time interval. A new input for each time interval causes the pulse to be generated at a particular time within the interval. As discussed in more detail below, the position of one or more pulses within the time interval may be used to set up one or more concurrent communication channels with another communication device.

Figure 1B:
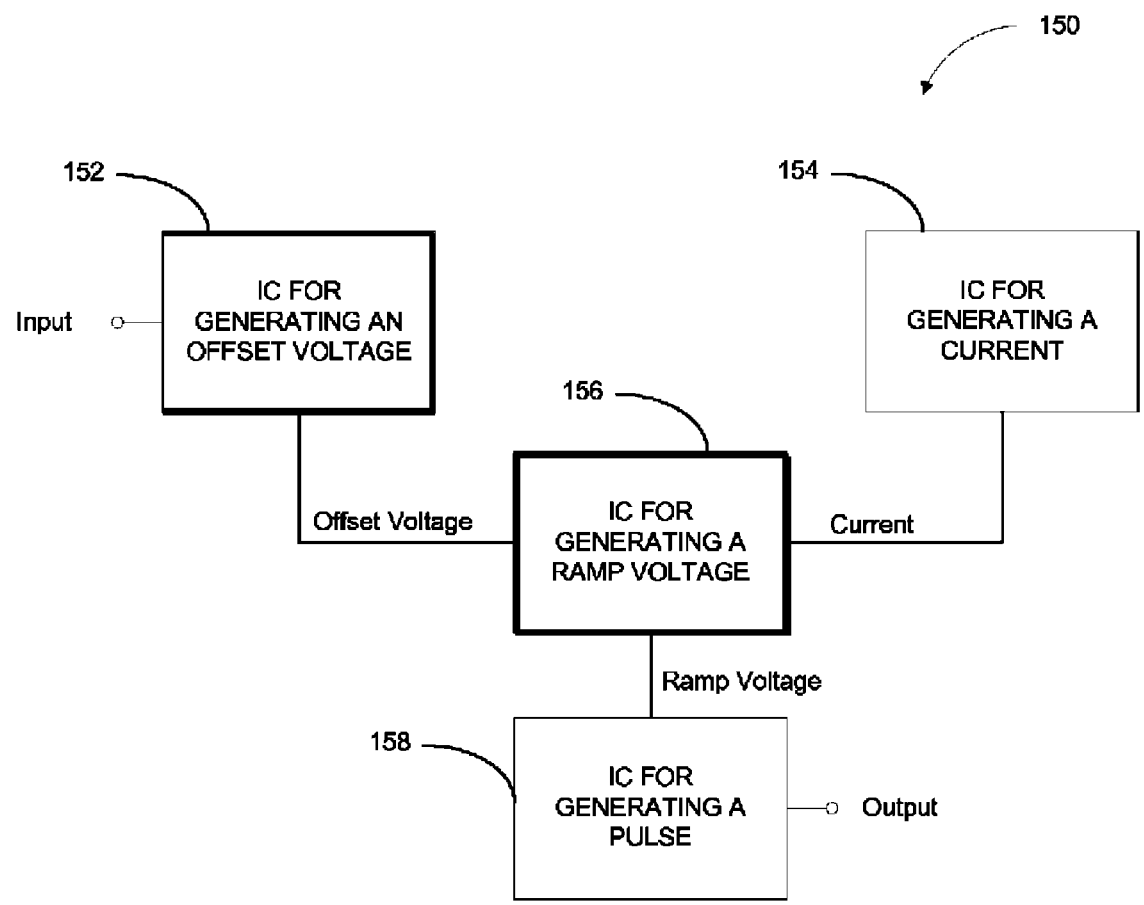

FIG. 1B illustrates a block diagram of an exemplary apparatus 150 for generating a pulse, as a function of an input. The apparatus 150 may be implemented as one or more integrated circuits (ICs). In this example, ICs 152, 154, 156, and 158 are used as means for generating the offset voltage, current, ramp voltage, and pulse in a similar manner as previously described.

Figure 1C:
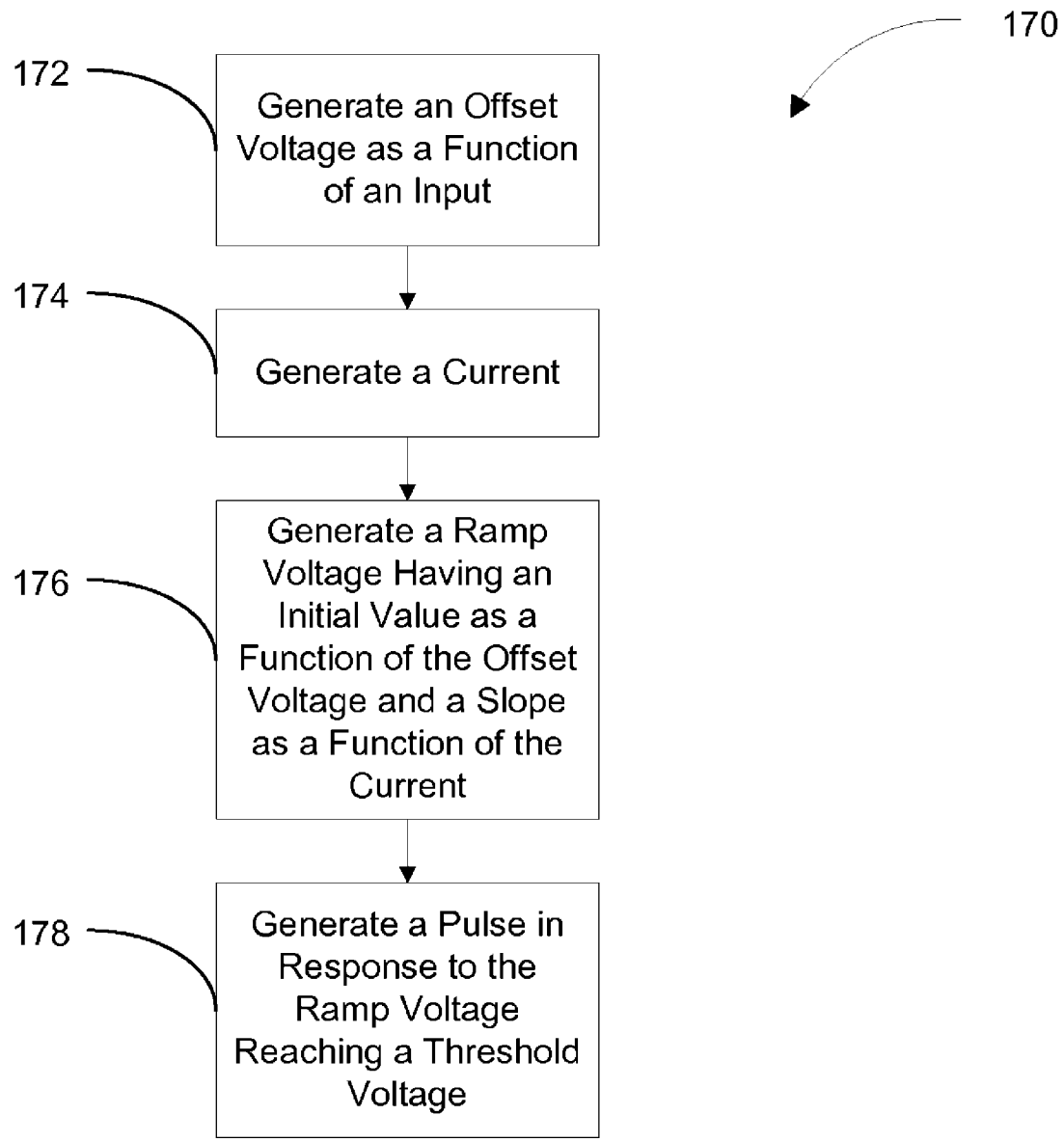
FIG. 1C illustrates a flow diagram of an exemplary method of generating a pulse in accordance with some aspects of the disclosure.

FIG. 1C illustrates a flow diagram of an exemplary method 170 of generating a pulse in accordance with another aspect of the disclosure. According to the method 170, an offset voltage is generated that is a function of an input, such as an input digital word (block 172). Additionally, a current is generated (block 174). Further, a ramp voltage is generated having an initial value as a function of the offset voltage and a slope as a function of the current (block 176). Then, a pulse is generated when the ramp voltage reaches a threshold voltage (block 178).

Figure 3:
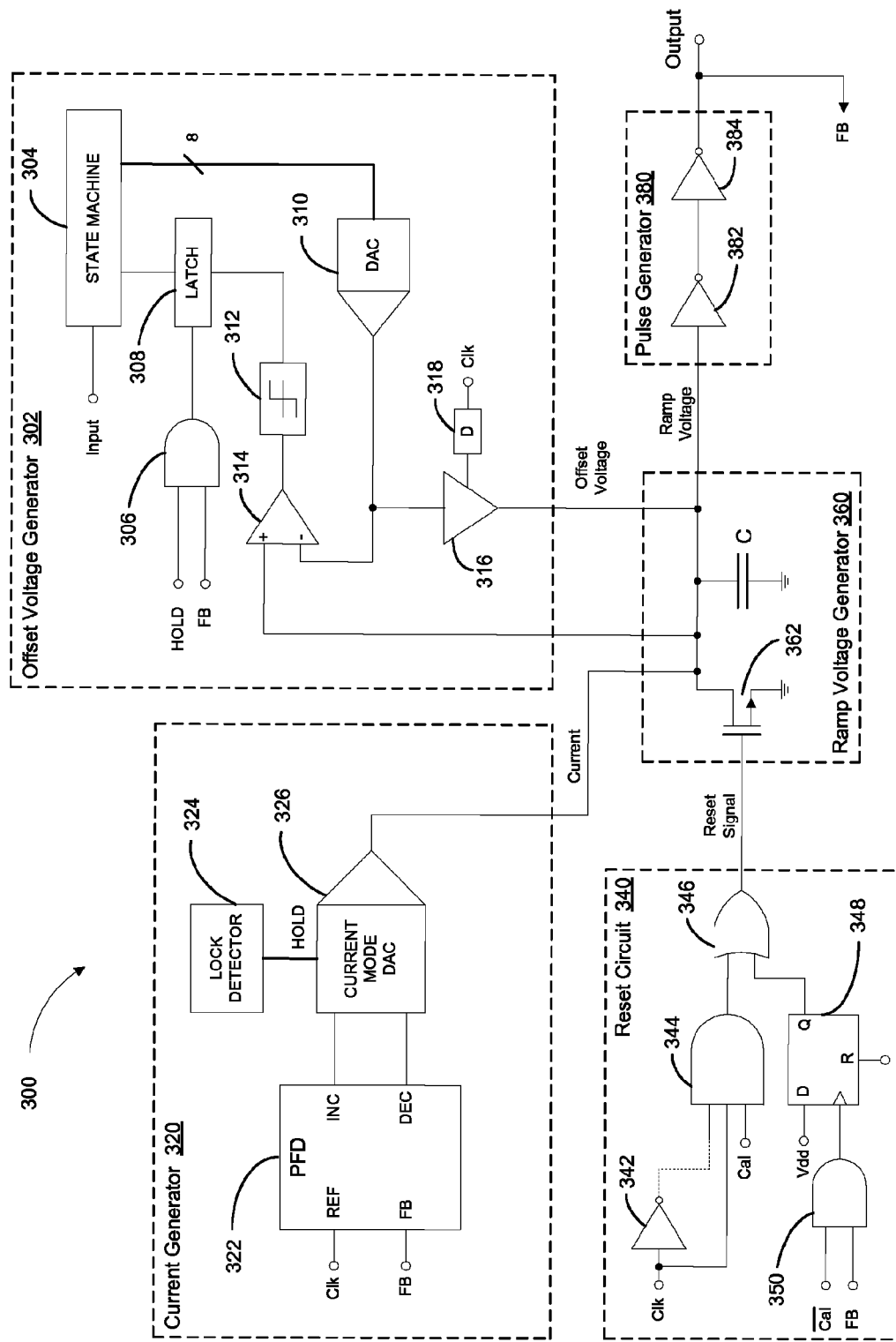
FIG. 3 illustrates a schematic diagram of an exemplary apparatus for generating a pulse in accordance with some aspects of the disclosure.

FIG. 3 illustrates a schematic diagram of an exemplary apparatus 300 for generating a pulse in accordance with some aspects of the disclosure. The apparatus 300 is one example of a detailed implementation of the apparatuses 100 and 150 previously discussed. As in previous aspects, the apparatus 300 generates a pulse at a particular time dictated by an input. As discussed below in connection with a communication device, the apparatus 300 may be used to set up one or more concurrent communication channels using a particular type of pulse modulation, such as PDMA.

In particular, the apparatus 300 comprises an offset voltage generator 302, a current generator 320, a reset circuit 340, a ramp voltage generator 360, and a pulse generator 380. The offset voltage generator 302 generates an offset voltage as a function of an input. The current generator 320 generates a substantially constant current. The ramp voltage generator 360 generates a ramp voltage that has an initial value as a function of the offset voltage, and a slope as a function of the current. In these exemplary aspects, the initial value of the ramp voltage is substantially the same as the offset voltage. In addition, the ramp voltage generator 360 generates the ramp voltage by substantially integrating the current received from the current generator 320.

The pulse generator 380 generates a pulse when the ramp voltage reaches a threshold voltage. The reset circuit 340 discharges the integrator of the ramp voltage generator 360 in response to the lead edge of the pulse to cause the pulse generator 380 to generate the tail edge of the pulse when the integrator voltage falls below the threshold of the pulse generator 380. The reset circuit 340 may be configured to initiate the tail edge of the pulse to achieve a particular pulse width for the generated pulse.

The offset voltage generator 302 also includes a calibration circuit to calibrate the offset voltage to correlate the input with the particular time of the generation of the pulse. More specifically, the offset voltage calibration circuit determines the input that produces an offset voltage substantially equal to the threshold voltage of the pulse generator 380. Additionally, the current generator 320 includes a calibration circuit to calibrate the current to also correlate the input with the particular time of the generation of the pulse. More specifically, the current calibration circuit generates a current that produces a ramp voltage that reaches the threshold voltage of the pulse generator 380 at approximately the end of a time interval for an offset voltage that corresponds to the earliest pulse position within the time interval. As discussed in more detail below, the reset circuit 340 assists in the calibration of the current.

In more detail, the offset voltage generator 302 comprises a state machine 304, a digital-to-analog (DAC) converter 310, a transfer gate 316, a delay element 318, a differential amplifier 314, a threshold detector 312, a latch 308, and an AND-gate 306. The DAC 310 generates the offset voltage in response to the input, which, in this example, may be an 8-bit digital word. The transfer gate 316 transfers the offset voltage to the ramp voltage generator 360 in response to a delayed edge of a clock signal Clk, whose period defines a time interval. The remaining devices, namely the state machine 304, differential amplifier 314, threshold detector 312, latch 308, and AND-gate 306 are used to calibrate the offset voltage, as discussed in more detail below.

The current generator 320 comprises a phase and frequency detector (PFD) 322, a lock detector 324, and a current mode DAC 326. The current mode DAC 326 generates a substantially constant current, which is applied to the ramp voltage generator 360. The PFD 322 and lock detector 324 are used to calibrate the current, as discussed in more detail below.

The ramp voltage generator 360 comprises a capacitive element C and a transistor 362. The capacitive element C serves to initially receive the offset voltage from the offset voltage generator 302 so that the ramp voltage generated by the ramp voltage generator 360 has an initial value substantially equal to the offset voltage. The capacitive element C also serves as an integrator to substantially integrate the current received from the current generator 320 to generate the ramp voltage. Accordingly, the ramp voltage has an initial value as a function of the offset voltage, and a slope as a function of the current. The transistor 362 is responsive to a reset signal generated by the reset circuit 340 to discharge the capacitive element C in response to the pulse being initiated, as explained in more detail below.

The pulse generator 380 comprises a pair of inverters 382 and 384 coupled in series. The input of the first inverter 382 receives the ramp voltage from the ramp voltage generator 360. The output of the second inverter 384 generates the pulse. The output of the second inverter 384 is also fed back to the reset circuit 340 in order for the reset circuit 340 to generate the reset signal that causes the discharge of the capacitive element C. Thus, when the ramp voltage reaches the threshold voltage of the inverter 382, the output of the inverter 382 changes from a logic high voltage to a logic low voltage, which, in turn, causes the output of the inverter 384 to change from a logic low voltage to a logic high voltage. This produces the leading edge of the pulse.

The leading edge of the pulse is fed back to the reset circuit 340, which causes the reset circuit 340 to generate the reset signal. The reset signal turns on the transistor 362, which forces the voltage on the capacitor to ground potential. This, in turn, causes the output of the first inverter 382 to change from a logic low voltage to a logic high voltage, which, in turn, causes the output of the second inverter 384 to change from a logic high voltage to a logic low voltage. This produces the trailing edge of the pulse.

The reset circuit 340 comprises an AND-gate 350, a latch 348, an inverter 342, a three-input AND-gate 344, and an OR-gate 346. As previously mentioned, the reset circuit 340 generates the reset signal to cause the discharge of the capacitive element C in response to the leading edge of the pulse generated by the pulse generator 380. The reset circuit 340 is also used in the calibration of the current generated by the current generator 320, as discussed in more detail below. In normal operation, the calibration signal CAL is set to a logic low level. In calibration mode, the calibration signal CAL is set to a logic high level.

In normal operation, the AND-gate 350 propagates the feedback signal to the clock input of the latch 348, since the inverted calibration signal is logically high. Thus, in response to the pulse generator 380 generating the leading (e.g., rising) edge of the pulse, the AND-gate 350 generates a rising edge, which is applied to the clock input of the latch 348. The rising edge causes the voltage at the data (D) input of the latch 348, which is tied to a logic high voltage Vdd, to propagate to the Q-output of the latch 348. The OR-gate 346, in turn, propagates the logic high voltage at the Q-output of the latch 348 to the gate of the transistor 362 of the ramp voltage generator 360. This turns on the transistor 362, thereby grounding the capacitive element C. Thus, the ramp voltage quickly goes to a logic low voltage, causing the first inverter 382 to transition from a logic low voltage to a logic high voltage, which, in turn, causes the second inverter 384 to transition from a logic high voltage to a logic low voltage. This produces the trailing edge of the pulse.

At the beginning of a new time interval, the latch 348 is reset by the rising edge of the clock source Clk. This causes the Q-output of the latch 348 to transition to a logic low voltage, which is propagated to the transistor 362 by the OR-gate 346. This causes the transistor 362 to turn off, thereby allowing the capacitive element C to receive a new offset voltage and the current to generate the ramp voltage.

The remaining elements of the reset circuit 340, namely the inverter 342 and three-input AND-gate 344, are used exclusively for the current calibration procedure, as discussed in more detail further below. The normal operation of the apparatus 300 is discussed in more detail below with reference to FIGS. 4A-B.

Figure 4A:
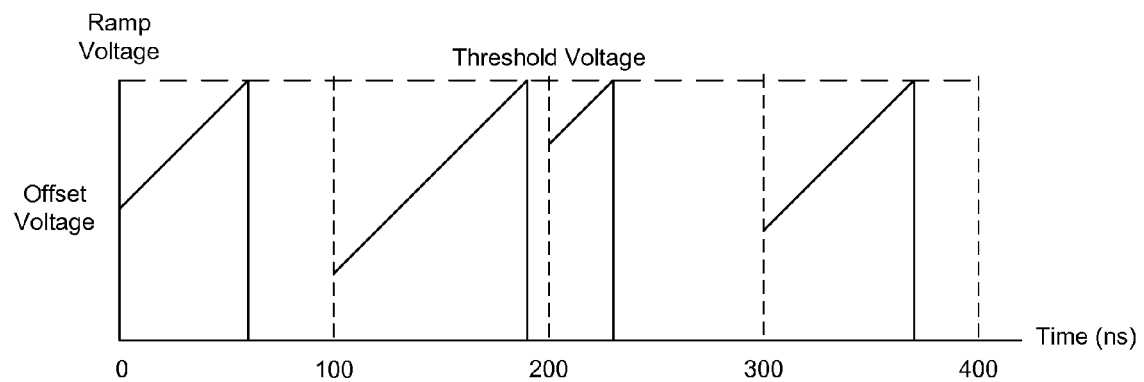
FIGS. 4A-B illustrate graphs of exemplary signals generated by the exemplary apparatus for generating a pulse in accordance with some aspects of the disclosure.
Figure 4B:
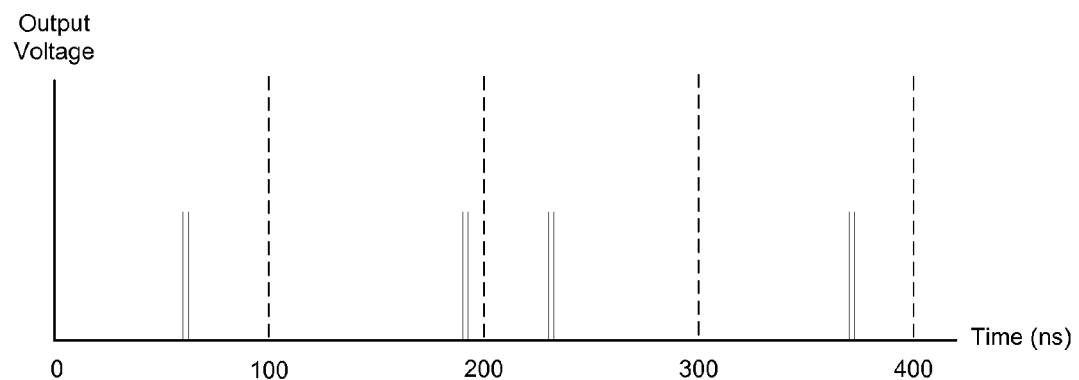

FIGS. 4A-B illustrate graphs of the exemplary ramp voltages and pulses in relation to time generated by the exemplary pulse position modulator 300 in accordance with some aspects of the disclosure. In this example, the times zero (0), 100 ns, 200 ns, and 300 ns represent the beginnings of different time intervals. These are delineated in the graphs as respective vertical dashed lines, except for the solid vertical line corresponding to time zero (0). A clock signal Clk having a frequency of, for example, 10 MHz may be used to define the 100 ns time interval.

With further reference to FIG. 3, at time zero (0), the output of the pulse generator 380 is at a logic low voltage. This is because the voltage across the capacitive element C is also at a logic low voltage (e.g., ~0V), which causes the first inverter 382 of the pulse generator 380 to generate a logic high voltage, which, in turn, causes the second inverter 384 of the pulse generator 380 to generate a logic low voltage.

As previously discussed, an edge (e.g., the rising edge) of the clock signal Clk initiates a time interval. Thus, at time zero (0), the rising edge of the clock signal Clk causes the latch 348 of the reset circuit 340 to reset. In response, the latch 348 generates a logic low voltage at its Q-output, which is transferred by the OR-gate 346 to the gate of the transistor 362, thereby turning off the transistor 362. This allows the capacitive element C to receive the offset voltage from the offset voltage generator 302 and the current from the current generator 320. Also, at time zero (0), the offset voltage generated by the DAC 310 in response to the input is transferred by the transfer gate 316 to the capacitive element C in response to delayed rising edge of the clock signal Clk.

As shown in FIG. 4A, in this example, the offset voltage is set to slightly above the middle of its range. At time zero (0), the capacitive element C begins to integrate the current from the current generator 320 to produce the increasing ramp voltage. When the ramp voltage reaches the threshold voltage of the first inverter 382 of the pulse generator 380, the output of the first inverter 382 transitions from a logic high voltage to a logic low voltage. This causes output of the second inverter 384 of the pulse generator 380 to transition from a logic low voltage to a logic high voltage. This produces the rising edge of the pulse at around 60 ns.

The rising edge of the pulse is fed back to the input of the AND-gate 350, which causes the output of the AND-gate 350 to transition from a logic low voltage to a logic high voltage. This transition causes the latch 348 to propagate the logic high voltage at its D-input to its Q-output. The OR-gate 346, in turn, propagates the logic high voltage at the latch Q-output to the gate of the transistor 362, thereby turning on the transistor 362. The turning on of the transistor 362 causes the capacitive element C to shunt to ground, thereby dramatically reducing the ramp voltage as shown by FIG. 4A. This transition causes the output of the first inverter 382 to transition from a logic high voltage to a logic low voltage. This transition, in turn, causes the second inverter 384 to transition from a logic high voltage to a logic low voltage, thereby producing the trailing edge of the pulse as shown in FIG. 4B. The feedback loop between the output of the pulse generator 380 and the input of the ramp voltage generator 360 via the reset circuit 340 may be configured to generate a pulse with a predefined width (e.g., one ns).

After the completion of the first time interval, the clock source Clk initiates the second time interval beginning at time 100 ns. In the second time interval, the DAC 310 generates a new offset voltage in response to a new input. In this example, the new offset voltage is set relatively low with respect to its range. Thus, as shown in FIG. 4A, because the new offset voltage is lower, it takes more time for the ramp voltage to reach the threshold voltage. Consequently, the pulse is generated relatively late within the second time interval. As shown in FIG. 4B, the pulse was generated at approximately 190 ns within the 100 to 200 ns time interval.

Similarly, after the completion of the second time interval, the clock source Clk initiates the third time interval beginning at time 200 ns. In the third time interval, the DAC 310 generates a new offset voltage in response to a new input. In this example, the new offset voltage is set relatively high with respect to its range. Thus, as shown in FIG. 4A, because the new offset voltage is set relatively high, it takes less time for the ramp voltage to reach the threshold voltage. Consequently, the pulse is generated relatively early within the third time interval. As shown in FIG. 4B, the pulse was generated at approximately 230 ns within the 200 to 300 ns time interval.

Similarly again, a lower mid-range offset voltage generated by the DAC 310 in response to a new input for the fourth time interval results in a pulse generated, for example, at 370 ns within the 300 to 400 ns time interval.

The apparatus 300 may be configured to provide a predefined time resolution for the generation of the pulse. For example, the apparatus modulator 300 may be configured to produce a pulse at a selected time slot (dictated by the input) among 100 available time slots within the 100 ns time interval. For instance, the input may range from 0001110 { binary 28} to 1110010 {binary 228} in steps of 10 {binary 2} to correspond to time slots 1-100 ns within the time interval. Additionally, as previously discussed, the feedback loop from the output of the pulse generator 380 to the input of the ramp voltage generator 360 via the reset circuit 340 may be configured to produce, for example, a one (1) ns pulse width. Thus, each pulse may be generated at a unique and substantially non-overlapping time slot within the time interval that is dictated by the input.

Figure 5A:
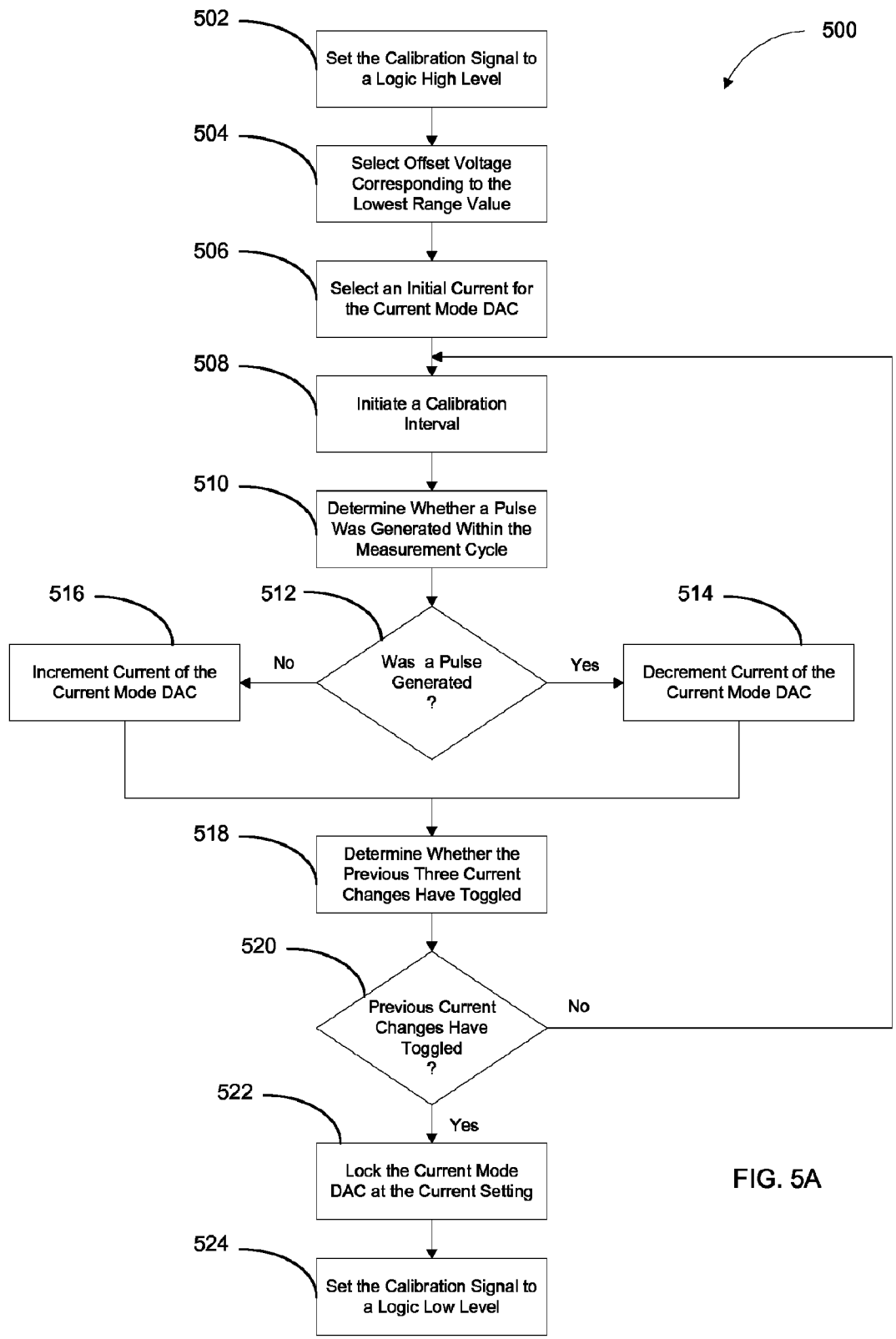
FIG. 5A illustrates a flow diagram of an exemplary method of calibrating a current generated by the exemplary apparatus for generating a pulse in accordance with some aspects of the disclosure.

FIG. 5A illustrates a flow diagram of an exemplary method 500 of calibrating a current generated by the exemplary apparatus 300 in accordance with some aspects of the disclosure. The current calibration method 500 entails setting the offset voltage at the lowest value of its range, which should correspond to the last time slot of the time interval; then, initiating successive calibration intervals while adjusting the current for each interval until the ramp voltage crosses the threshold voltage at the beginning of the last time slot of the time interval.

With reference to both FIGS. 3 and 5A, according to the current calibration method 500, the calibration signal Cal is set to a high logic level (block 502). This disables the AND-gate 350, thereby preventing the feedback (FB) signal from turning on the transistor 362 of the ramp voltage generator 360. This also enables the three-input AND gate 344 to allow the clock source Clk to discharge the capacitive element C at the beginning of a calibration interval. Also, according to the current calibration method 500, the DAC 310 is configured to generate an offset voltage corresponding to the lowest value of its range (block 504). In this example, the lowest offset voltage may be 200 mV. Next, according to the calibration method 500, the current mode DAC 326 is set to generate an initial current (block 506).

Then, according to the current calibration method 500, a calibration interval is initiated (block 508). For example, the rising edge of the clock signal Clk may be used to initiate a calibration interval. In this regard, the rising edge causes the reset circuit 340 to generate a reset signal having a relatively low duty cycle pulse to remove any charges remaining on the capacitive element C. This is accomplished by the three inputs of the AND-gate 344 being at a logic high level immediately after the clock signal Clk transitions to a logic high level. This generates the leading edge of the pulse that causes the transistor 362 to conduct to discharge the capacitive element C. When the inverter 342 inverts the logic high level into a logic low level, the AND-gate 344 generates a logic low level, thereby generating the trailing edge of the reset pulse. Thus, the delay of the resetting pulse is substantially equal to the delay of the inverter 342 in generating the logic low level in response to the clock signal transitioning to the logic high level.

The rising edge of the clock signal also causes the transfer gate 316 to transfer the offset voltage to the capacitive element C after a delay produced by delay element 318 that is substantially equal to the delay of the inverter 342. The delay element 318 prevents the gating of the offset voltage to the capacitive element C when the transistor 362 is turned on. At substantially the same time, the capacitive element C begins to integrate the initial current generated by the current mode DAC 326 to develop the ramp voltage. During this calibration interval, the PFD 322 monitors the feedback signal (FB) to determine whether a pulse was generated during the interval (block 510). In this regard, if the PFD 322 detects the arrival of the rising edge of the clock signal Clk at its REF input without detecting the rising edge of the pulse at its FB input, then no pulse was generated during the calibration interval. If, on the other hand, the PFD 322 detects the arrival of the pulse at its FB input before it detects the rising edge of the clock signal Clk at its REF input, then a pulse was generated during the calibration interval.

If the PFD 322 determines that a pulse was generated (block 512), then the PFD decrements the current generated by the current mode DAC 326 by generating a logic high signal at its DEC output and a logic low signal at its INC output (block 514). This means that the initial current was set above the calibrated current. If, on the other hand, the PFD 322 determines that no pulse was generated (block 512), the PFD 322 increments the current generated by the current mode DAC 326 by generating a logic high signal at its INC output and a logic low signal at its DEC output (block 516).

The lock detector 324 then determines whether the previous three or more current changes have toggled (block 518). If the previous current changes have toggled, it means that the current generated by the current mode DAC 326 is calibrated to within one LSB. Thus, if the lock detector 324 determines that the previous current changes have toggled (block 520), the lock detector 324 sends a signal to the current mode DAC 326 to lock the current mode DAC 326 at the current setting (block 522). Preferably, the lock detector 324 locks the current mode DAC 326 at the lowest current setting that causes the generation of the pulse. If, on the other hand, the lock detector 324 has not determined that the previous current changes have toggled, a new calibration interval is commenced per block 508. Once the current mode DAC 326 is calibrated, the calibration signal CAL is set to a logic low level (block 524).

Figure 5B:
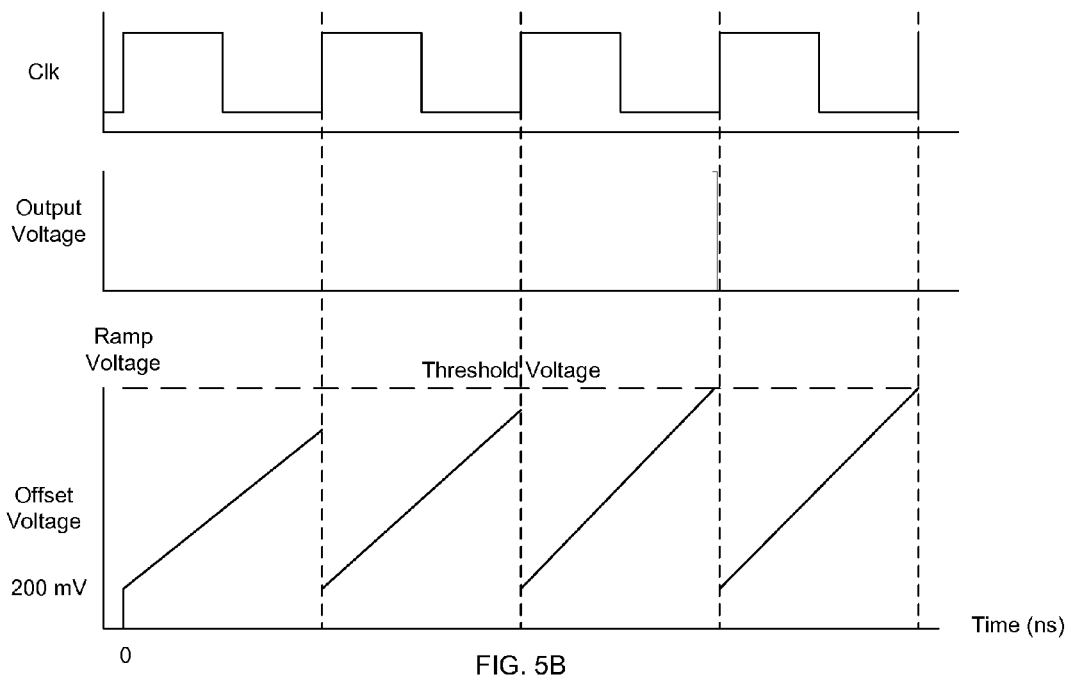
FIGS. 5B-C illustrate graphs of various signals generated by the exemplary apparatus for generating a pulse during a calibration procedure in accordance with some aspects of the disclosure.
Figure 5C:
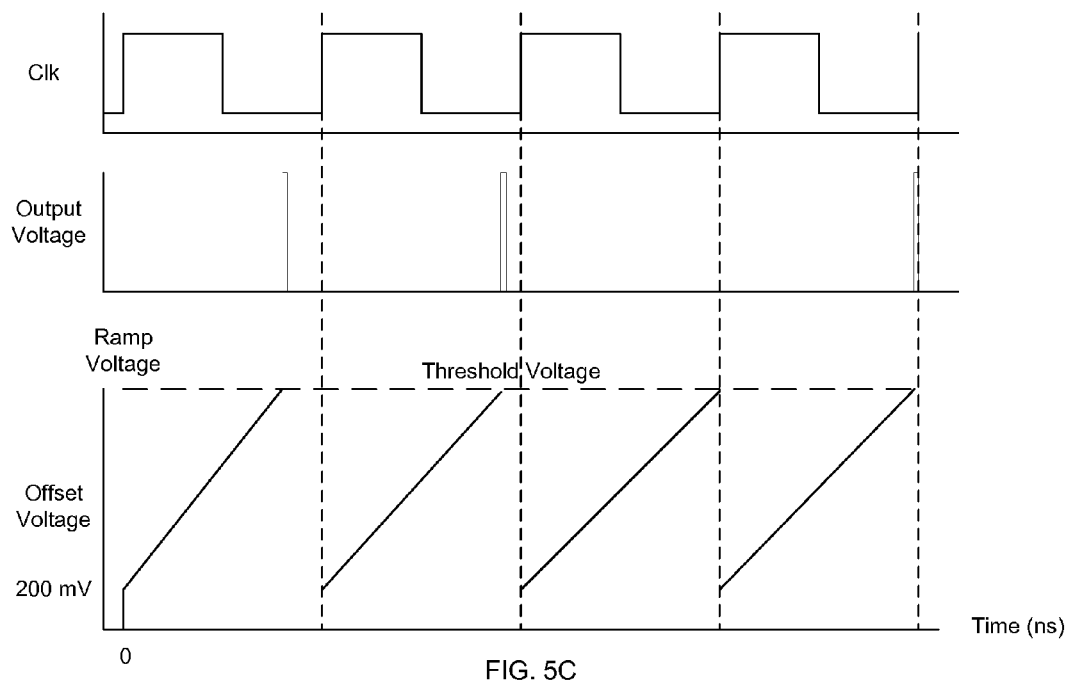

FIGS. 5B-C illustrate graphs of various signals generated by the apparatus 300 during a calibration procedure in accordance with some aspects of the disclosure. FIG. 5B deals with the situation where the initial current generated by the current mode DAC 326 is lower than the calibrated current. Whereas, FIG. 5C deals with the situation where the initial current generated by the current mode DAC 326 is higher than the calibrated current.

As FIG. 5B illustrates, in the first calibration interval, the ramp voltage does not reach the threshold voltage before the next rising edge of the clock signal Clk. As a result, no pulse is generated in the first calibration interval. This means that the initial current generated by the current mode DAC 326 is lower than the calibrated current. As previously discussed, in response, the PFD 322 increases the current generated by the current mode DAC 326. In the second calibration interval, the ramp voltage still does not reach the threshold voltage before the next rising edge of the clock signal Clk, but is closer than the ramp voltage of the first calibration interval. Consequently, no pulse is generated in the second calibration interval. This means that the current generated by the current mode DAC 326 is still below the calibrated current. Again, in response, the PFD 322 increases the current generated by the current mode DAC 326.

In the third calibration interval, the ramp voltage reaches the threshold voltage before the next rising edge of the clock signal Clk. As a result, a pulse is generated in the third calibration interval as shown. This means that the current generated by the current mode DAC 326 may be calibrated or above the calibrated current. In response, the PFD 322 decreases the current generated by the current mode DAC 326. In the fourth calibration interval, the ramp voltage does not reach the threshold voltage before the next rising edge of the clock signal Clk. The lock detector 324 detects that the previous three current changes have toggled, and thus locks the current mode DAC 326 at the lowest current that produces a pulse.

Similarly, as FIG. 5C illustrates, in the first calibration interval, the ramp voltage reaches the threshold voltage before the next rising edge of the clock signal Clk. As a result, a pulse is generated in the first calibration interval. This means that the initial current generated by the current mode DAC 326 is above the calibrated current. In response, the PFD 322 decreases the current generated by the current mode DAC 326. In the second calibration interval, the ramp voltage still reaches the threshold voltage before the next rising edge of the clock signal Clk. Consequently, a pulse is generated in the second calibration interval. This means that the current generated by the current mode DAC 326 is still above the calibrated current. Again, in response, the PFD 322 decreases the current generated by the current mode DAC 326.

In the third calibration interval, the ramp voltage does not reach the threshold voltage before the next rising edge of the clock signal Clk. As a result, no pulse is generated in the third calibration interval. This means that the current generated by the current mode DAC 326 may be calibrated or slightly below the calibrated current. In response, the PFD 322 increases the current generated by the current mode DAC 326. In the fourth calibration interval, the ramp voltage does reach the threshold voltage before the next rising edge of the clock signal Clk. The lock detector 324 detects that the previous three current changes have toggled, and thus locks the current mode DAC 326 at the lowest current that produces a pulse.

Figure 6:
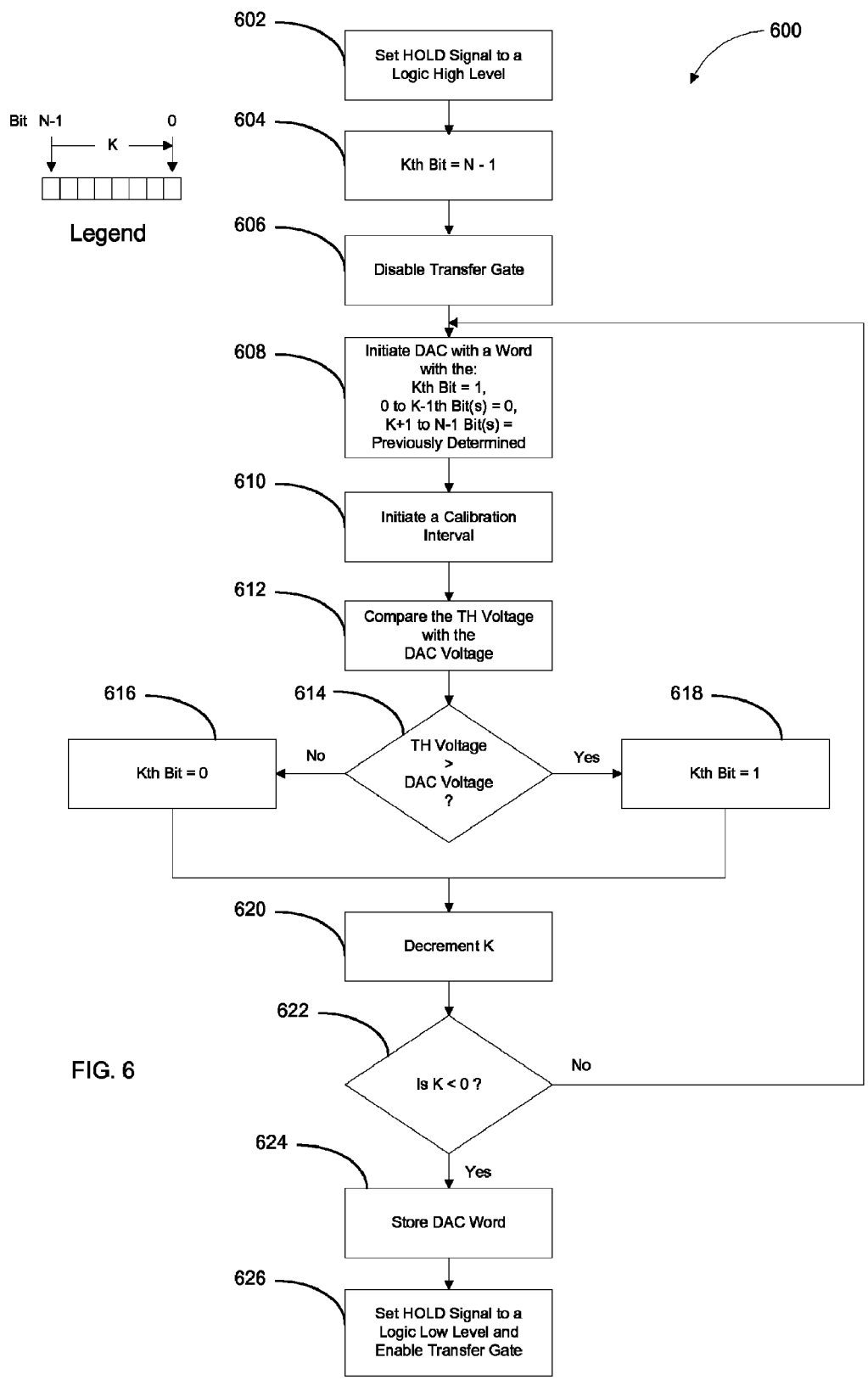
FIG. 6 illustrates a flow diagram of an exemplary method of calibrating an offset voltage generated by the exemplary apparatus for generating a pulse in accordance with some aspects of the disclosure.

FIG. 6 illustrates a flow diagram of an exemplary method 600 of calibrating an offset voltage generated by the apparatus 300 in accordance with some aspects of the disclosure. The offset voltage calibration method 600 determines the input word for the DAC 310 that produces an offset voltage that corresponds to the threshold voltage of the pulse generator 380. In this example, this is accomplished by setting the input word for the DAC 310 initially at mid range. Then, through a process of successive approximation, the input word for the DAC 310 is successively changed to produce an offset voltage that successively gets closer to the threshold voltage, until it reaches the threshold voltage.

As shown in the legend of FIG. 6, the most significant bit (MSB) of the input word for the DAC 310 is represented as the N–1 bit, where N is the number of bits in the DAC input word. The least significant bit (LSB) of the input word for the DAC 310 is represented as the zero (0) bit. The $k^{th}$ bit of the input word for the DAC 310 is the bit index whose value is to be determined so that the final input word for the DAC 310 results in an offset voltage substantially equal to the threshold of the pulse generator 380.

With reference to both FIGS. 3 and 6, when the offset calibration method 600 is initiated, the HOLD signal is set to a logic high level (block 602). This enables the AND-gate 306 and allows the feedback (FB) signal to trigger the latch 308, as discussed in more detail below. The state machine 304 then sets the bit index k to the MSB (N–1) of the input word for the DAC 310 (block 604). This is because the MSB of the DAC input word is the first bit to be determined. During calibration of the offset voltage, the transfer gate 316 is disabled (block 606). This causes the ramp voltage generated by the ramp voltage generator 360 to generate a ramp voltage with an initial value near zero (0) Volt during calibration. This ensures that the ramp voltage is always lower than the DAC voltage at the beginning of a calibration cycle.

Then, the state machine 304 initiates the DAC 310 with an input word having the bit index k equal to a logic one (1), the zero (0) to $k-1^{th}$ bit(s) to a logic zero (0), and if applicable, the bit(s) k+1 to N–1 as previously determined (block 608). Taking an 8-bit DAC word as an example, the state machine 304 initially sets the 7th bit (MSB) to a logic one (1), and the zero (0) to $6^{th}$ bits to a logic zero (0). The bit(s) k+1 to N–1 is not applicable since the bit index k is currently set to the MSB. Thus, the first DAC word is 1000000, which is the middle of the range for the DAC word.

Then, a calibration interval is initiated (block 610). In this example, the calibration interval is initiated by the rising edge of the clock signal Clk causing the latch 348 of the reset circuit 340 to reset and cause the transistor 362 to turn off so that the capacitive element C is able to be charged by the current generated by the current generator 320.

During the calibration interval, the differential amplifier 314 and the threshold detector 312 generate an output indicative of whether the ramp voltage is greater than the DAC voltage. When the ramp voltage reaches the threshold voltage of the pulse generator 380, the feedback (FB) signal transitions to a logic high level. This causes the latch 308 to output the results of the comparison of the threshold voltage to the DAC voltage to the state machine 304 (block 612). The state machine 304 then determines whether the threshold voltage is greater than the DAC voltage (block 614). If the state machine 304 determines that the threshold voltage is greater than the DAC voltage, the state machine 304 assigns the bit index k to a logic one (1) (block 618). Otherwise, the state machine 304 assigns the bit index k to a logic zero (0) (block 616).

The state machine 304 then decrements the bit index k so that it is set to the next bit of the input DAC word (block 620). In this example, the bit index k becomes the $6^{th}$ bit of the input word for the DAC 310. The state machine 620 then determines whether the bit index k is less than zero (0). If it is not, the operations 608 to 620 are repeated again to determine the value for the new bit index k. If the state machine 304 determines that the bit index k is less than zero (0), which means that all the bits of the DAC word have been determined, the state machine 304 stores the DAC word in memory (block 624), and then the transfer gate 316 is enabled and the HOLD signal is set to a logic low level to configure the programmable offset voltage generator 302 to operation mode (block 626).

After the current and the offset voltage are calibrated, the correlation between the input and the time of the generation of the pulse is known. For instance, the DAC word that results in the lowest offset voltage is known, and correlates with the earliest time slot for the pulse. Also, the DAC word that results in the threshold voltage of the pulse generator is also known, and correlates with the latest time slot for the pulse. The DAC words for time slots between the earliest and latest time slots can be determined by interpolation.

Figure 7:
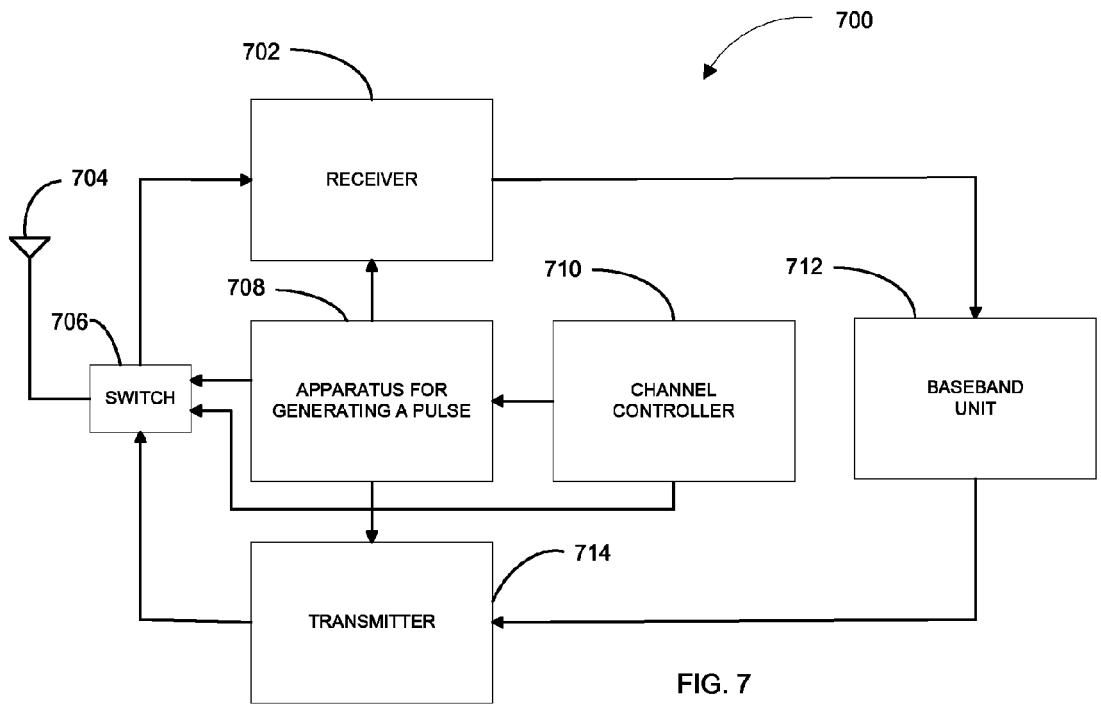
FIG. 7 illustrates a block diagram of an exemplary communication apparatus in accordance with some aspects of the disclosure.

FIG. 7 illustrates a block diagram of an exemplary communication device 700 that uses an apparatus for generating a pulse in accordance with some aspects of the disclosure. The communication device 700 comprises a receiver 702, an antenna 704, a switch 706, a pulse generating apparatus 708, a channel controller 710, a baseband unit 712, and a transmitter 714. The transmitter 714 is configured to establish a channel, such as an ultra-wide band (UWB) channel, for transmission of information to another communication device. The receiver 702 is configured to establish a channel, such as an ultra-wide band (UWB) channel, for receiving information from another communication device. The transmitting and receiving channels may be established concurrently. An ultra-wide band channel may be defined as a channel having a fractional bandwidth on the order of 20% or more, has a bandwidth on the order of 500 MHz or more, or has a fractional bandwidth on the order of 20% or more and has a bandwidth on the order of 500 MHz or more. The fractional bandwidth is a particular bandwidth associated with a device divided by its center frequency. For example, a device according to this disclosure may have a bandwidth of 1.75 GHz with center frequency of 8.125 GHz and thus its fractional bandwidth is 1.75/8.125 or 21.5%.

If the communication device 700 is configured as a wireless device, such as an IEEE 802.11 or 802.15 related wireless device, the antenna 704 serves as an interface to a wireless medium for wirelessly transmitting and receiving information from other wireless device. Under the control of the channel controller 710, the switch 706 substantially isolates the receiver 702 from the transmitter 714 when the communication device 700 is transmitting. The baseband unit 712 process baseband signals received from the receiver 702, and process baseband signals for transmission by the transmitter 714.

The pulse generating apparatus 708 of the communication device 700 may be any of the exemplary aspects previously described herein. Under the control of the channel controller 710, the apparatus 708 is used to enable the transmitter and receiver at different intervals defined by the pulse widths for transmission and reception of signals. In such configuration, communication channels may be established by using various pulse division multiple access (PDMA) modulation schemes. Such PDMA modulation schemes set up channels based on the position of pulses that govern the time intervals for transmitting and receiving. Examples of PDMA modulation schemes include pulse repetition frequency (PRF) modulation, pulse position or offset modulation, and time hopping modulations, as explained below. During times when the transmitter is not transmitting and receiver is not receiving, these devices may be operated in low or no power mode to conserve power, such as power provided by a battery.

Figure 8A:
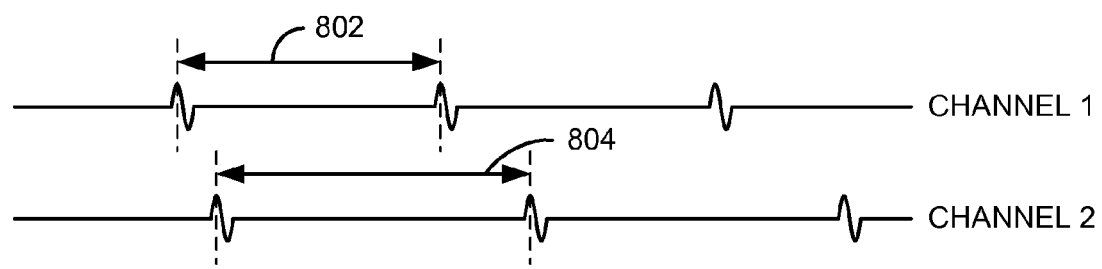
FIG. 8A-C illustrate timing diagrams of various pulse division multiple access (PDMA) modulation techniques in accordance with some aspects of the disclosure.

FIG. 8A illustrates different channels (channels 1 and 2) defined with different pulse repetition frequencies. Specifically, pulses for channel 1 have a pulse repetition frequency (PRF) corresponding to a pulse-to-pulse delay period 802. Conversely, pulses for channel 2 have a pulse repetition frequency (PRF) corresponding to a pulse-to-pulse delay period 804. This technique may thus be used to define pseudo-orthogonal channels with a relatively low likelihood of pulse collisions between the two channels. In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel. The channel controller 710 and pulse generating apparatus 708 may be configured to set up a pulse repetition frequency (PRF) modulation.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF). Conversely, a channel supporting relatively high data rates (e.g., on the order of a several megabits per second or Mbps) may employ a correspondingly higher pulse repetition frequency (PRF).

Figure 8B:
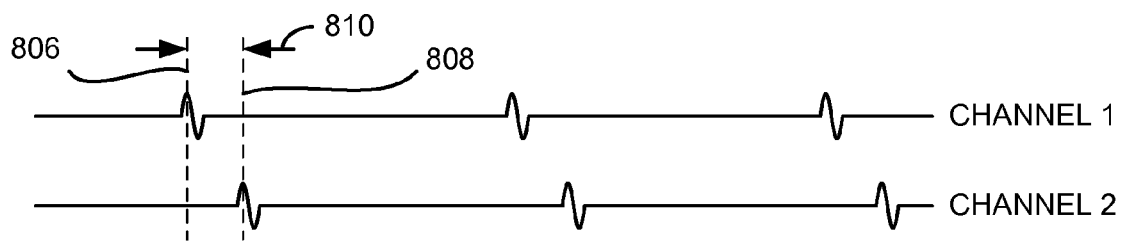

FIG. 8B illustrates different channels (channels 1 and 2) defined with different pulse positions or offsets. Pulses for channel 1 are generated at a point in time as represented by line 806 in accordance with a first pulse offset (e.g., with respect to a given point in time, not shown). Conversely, pulses for channel 2 are generated at a point in time as represented by line 808 in accordance with a second pulse offset. Given the pulse offset difference between the pulses (as represented by the arrows 810), this technique may be used to reduce the likelihood of pulse collisions between the two channels. Depending on any other signaling parameters that are defined for the channels and the precision of the timing between the devices (e.g., relative clock drift), the use of different pulse offsets may be used to provide orthogonal or pseudo-orthogonal channels. The channel controller 710 and pulse generating apparatus 708 may be configured to set up a position or offset modulation.

Figure 8C:
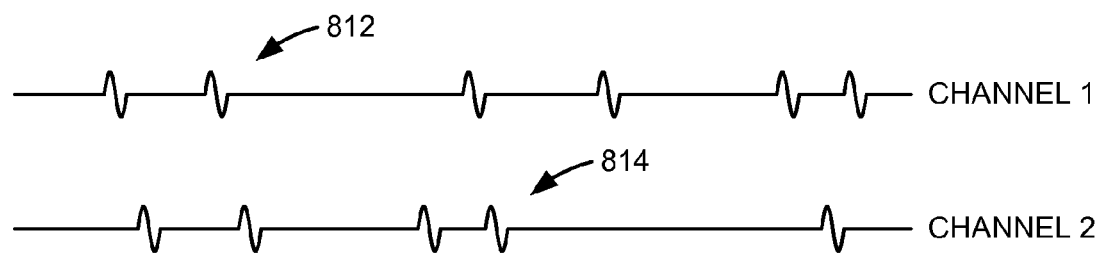

FIG. 8C illustrates different channels (channels 1 and 2) defined with different timing hopping sequences. For example, pulses 812 for channel 1 may be generated at times in accordance with one time hopping sequence while pulses 814 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels. The channel controller 710 and pulse generating apparatus 708 may be configured to set up a time hopping modulation.

It should be appreciated that other techniques may be used to define channels in accordance with a PDMA scheme. For example, a channel may be defined based on different spreading pseudo-random number sequences, or some other suitable parameter or parameters. Moreover, a channel may be defined based on a combination of two or more parameters.

Figure 9:
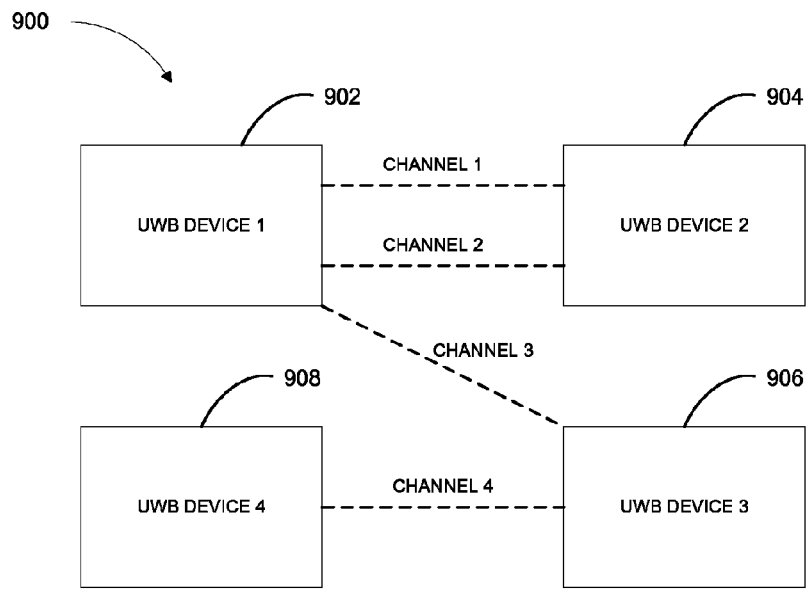
FIG. 9 illustrates a block diagram of various communication devices communicating with each other via various channels in accordance with some aspects of the disclosure.

FIG. 9 illustrates a block diagram of various ultra-wide band (UWB) communication devices communicating with each other via various channels in accordance with some aspects of the disclosure. For example, UWB device 1 902 is communicating with UWB device 2 904 via two concurrent UWB channels 1 and 2. UWB device 902 is communicating with UWB device 3 906 via a single channel 3. And, UWB device 3 906 is, in turn, communicating with UWB device 4 908 via a single channel 4. Other configurations are possible.

Any of these apparatuses described herein may take various forms. For example, in some aspects, the apparatus may be implemented in or comprise phone (e.g., a cellular phone), a personal data assistant ("PDA"), a headset (e.g., a headphone, an earpiece, etc.), a microphone, a medical device, a biometric sensor, a heart rate monitor, a pedometer, an EKG device, a user I/O device, a watch, a remote control, a switch, a light switch, a keyboard, a mouse, a tire pressure monitor, an entertainment device, a computer, a point-of-sale device, a hearing aid, a set-top box, or a device with some form of wireless signaling capabilities. Moreover, these apparatuses may have different power and data requirements. In some aspects, any apparatus described herein may be adapted for use in low power applications (e.g., through the use of a pulse-based signaling scheme and low duty cycle modes), and may support a variety of data rates including relatively high data rates (e.g., through the use of high-bandwidth pulses). In some aspects, any of the apparatuses described herein may be implemented in or comprise an access point such as a WiFi node. For example, such an apparatus may provide connectivity to another network (e.g., a wide area network such as the Internet) via a wired or wireless communication link.

Any of these apparatuses may include various components that perform functions based on signals transmitted or received via the wireless communication link. For example, a headset may include a transducer adapted to provide an audible output based on a signal received via the wireless communication link established by a receiver responsive to any of the pulse generating apparatuses described herein. Such a headset may also include a transmitter, responsive to any of the pulse generating apparatuses described herein, for transmitting a wireless signal including an audio output generated by a transducer. A watch may include a display adapted to provide a visual output based on a signal received via the wireless communication link by a receiver responsive to any of the pulse generating apparatus described herein. A medical device may include a sensor adapted to generate sensed signals to be transmitted via the wireless communication link by a transmitter responsive to any of the pulse generating apparatuses described herein.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the aspects of the disclosure have been described in connection with various aspects, it will be understood that the aspects are capable of further modifications. This application is intended to cover any variations, uses or adaptation of the various aspects of the disclosure following, in general, the principles of the disclosure, and including such departures from the present disclosure as come within the known and customary practice within the art to which the disclosure pertains.

What is claimed is:

1. An apparatus for generating at least one pulse based on an input, comprising:
    a first generator adapted to generate an offset voltage as a function of the input;
    a second generator adapted to generate a current;
    a third generator adapted to generate a ramp voltage having an initial value as a function of the offset voltage and a slope as a function of the current; and
    a fourth generator adapted to generate the at least one pulse in response to the ramp voltage substantially reaching a threshold voltage.

2. The apparatus of claim 1, wherein the slope of the ramp voltage is positive, negative, linear or non-linear.

3. The apparatus of claim 1, wherein the first generator comprises a digital-to-analog converter (DAC), and further wherein the input comprises a digital word.

4. The apparatus of claim 1, further comprising a calibration circuit adapted to calibrate the offset voltage to correlate the input with the generation of the at least one pulse.

5. The apparatus of claim 1, wherein the second generator comprises a current mode digital-to-analog converter (DAC).

6. The apparatus of claim 1, further comprising a calibration circuit adapted to calibrate the current to correlate the input with the generation of the at least one pulse.

7. The apparatus of claim 1, wherein the third generator comprises an integrating device adapted to integrate the current to generate the ramp voltage.

8. The apparatus of claim 7, wherein the integrating device comprises a capacitive element.

9. The apparatus of claim 1, wherein the fourth generator comprises a plurality of inverters coupled in series.

10. The apparatus of claim 1, further comprising a reset circuit adapted to generate a reset signal that initiates the generation of a tail edge of the at least one pulse.

11. The apparatus of claim 1, further comprising a clock source adapted to define a time interval within which the at least one pulse is generated.

12. The apparatus of claim 11, wherein the clock source is adapted to initiate the generation of the at least one pulse.

13. The apparatus of claim 1, further comprising a transceiver, wherein in response to the at least one pulse generated by the fourth generator, the transceiver is adapted to establish at least one ultra-wide band communication channel with another apparatus using pulse division multiple access.

14. The apparatus of claim 13, wherein each ultra-wide band channel has a fractional bandwidth on the order of 20% or more, has a bandwidth on the order of 500 MHz or more, or has a fractional bandwidth on the order of 20% or more and has a bandwidth on the order of 500 MHz or more.

15. A method of generating at least one pulse based on an input, comprising:
    generating an offset voltage as a function of the input;
    generating a current;
    generating a ramp voltage having an initial value as a function of the offset voltage and a slope as a function of the current; and
    generating the at least one pulse in response to the ramp voltage substantially reaching a threshold voltage.

16. The method of claim 15, wherein the slope of the ramp voltage is positive, negative, linear or non-linear.

17. The method of claim 15, wherein the initial value of the ramp voltage is substantially equal to the offset voltage.

18. The method of claim 15, wherein generating the offset voltage comprises converting a digital word to the offset voltage, and further wherein the digital word is a function of or the same as the input.

19. The method of claim 15, further comprising calibrating the offset voltage to correlate the input with the generation of the at least one pulse.

20. The method of claim 15, wherein generating the current comprises converting digital information to the current.

21. The method of claim 15, further comprising calibrating the current to correlate the input with the generation of the at least one pulse.

22. The method of claim 15, wherein generating the ramp voltage comprises integrating the current.

23. The method of claim 22, wherein integrating the current comprises employing a capacitive element to integrate the current.

24. The method of claim 15, wherein generating the at least one pulse comprises employing at least a pair of inverters coupled in series to generate the at least one pulse.

25. The method of claim 15, further comprising generating a clock that defines a time interval within which the at least one pulse is generated.

26. The method of claim 15, further comprising generating a clock to initiate the generation of the at least one pulse.

27. The method of claim 15, further comprising controlling a transceiver with the at least one pulse to establish at least one ultra-wide band communication channel using pulse division multiple access.

28. The method of claim 27, wherein each ultra-wide band channel has a fractional bandwidth on the order of 20% or more, has a bandwidth on the order of 500 MHz or more, or has a fractional bandwidth on the order of 20% or more and has a bandwidth on the order of 500 MHz or more.

29. An apparatus for generating at least one pulse based on an input, comprising
    means for generating an offset voltage as a function of the input;
    means for generating a current;
    means for generating a ramp voltage having an initial value as a function of the offset voltage and a slope as a function of the current; and
    means for generating the at least one pulse in response to the ramp voltage substantially reaching a threshold voltage.

30. The apparatus of claim 29, wherein the slope of the ramp voltage is positive, negative, linear or non-linear.

31. The apparatus of claim 29, wherein the means for generating the offset voltage comprises a digital-to-analog converter, and further wherein the input comprises a digital word.

32. The apparatus of claim 29, further comprising means for calibrating the offset voltage to correlate the input with the generation of the at least one pulse.

33. The apparatus of claim 32, wherein the means for calibrating the offset voltage comprises:
    a comparator adapted to generate an output indicative of whether the offset voltage is greater than the ramp voltage at the time the at least one pulse was generated; and
    a device adapted to determine a new offset voltage from the output of the comparator, wherein the new offset voltage is a closer approximation of the ramp voltage at the time the at least one pulse was generated than the present offset voltage.

34. The apparatus of claim 29, wherein the means for generating the current comprises a current mode digital-to-analog converter (DAC).

35. The apparatus of claim 29, further comprising means for calibrating the current to correlate the input with the generation of the at least one pulse.

36. The apparatus of claim 35, wherein the means for calibrating the current comprises a phase and frequency detector.

37. The apparatus of claim 29, wherein the means for generating the ramp voltage comprises a capacitive element.

38. The apparatus of claim 29, wherein the means for generating the at least one pulse comprises a plurality of inverters coupled in series.

39. The apparatus of claim 29, further comprising means for generating a clock adapted to define a time interval within which the at least one pulse is generated.

40. The apparatus of claim 29, further comprising means for generating a clock to initiate the generation of the least one pulse.

41. The apparatus of claim 29, further comprising means for establishing at least one ultra-wide band communication channel using the at least one pulse.

42. The apparatus of claim 41, wherein each ultra-wide band channel has a fractional bandwidth on the order of 20% or more, has a bandwidth on the order of 500 MHz or more, or has a fractional bandwidth on the order of 20% or more and has a bandwidth on the order of 500 MHz or more.

43. A computer program product for generating at least one pulse based on an input, comprising:
a computer readable medium comprising codes executable by at least one computer to:
generate an offset voltage as a function of the input;
generate a current;
generate a ramp voltage having an initial value as a function of the offset voltage and a slope as a function of the current; and
generate the at least one pulse in response to the ramp voltage substantially reaching a threshold voltage.

44. A headset for wireless communications, comprising:
a first generator adapted to generate an offset voltage as a function of the input;
a second generator adapted to generate a current;
a third generator adapted to generate a ramp voltage having an initial value as a function of the offset voltage and a slope as a function of the current;
a fourth generator adapted to generate at least one pulse in response to the ramp voltage substantially reaching a threshold voltage;
a transducer adapted to generate sensed data; and
a transmitter adapted to transmit the sensed data in response to the at least one pulse generated by the fourth generator.

45. A watch for wireless communications, comprising:
a first generator adapted to generate an offset voltage as a function of the input;
a second generator adapted to generate a current;
a third generator adapted to generate a ramp voltage having an initial value as a function of the offset voltage and a slope as a function of the current;
a fourth generator adapted to generate the at least one pulse in response to the ramp voltage substantially reaching a threshold voltage;
a receiver adapted to receive a signal in response to the at least one pulse generated by the fourth generator; and
a display adapted to provide a visual output based on the signal.

46. A medical device for wireless communications, comprising:
a first generator adapted to generate an offset voltage as a function of the input;
a second generator adapted to generate a current;
a third generator adapted to generate a ramp voltage having an initial value as a function of the offset voltage and a slope as a function of the current;
a fourth generator adapted to generate at least one pulse in response to the ramp voltage substantially reaching a threshold voltage;
a sensor adapted to generate sensed data; and
a transmitter adapted to transmit the sensed data in response to the at least one pulse generated by the fourth generator.

* * * * *

UNITED STATES PATENT AND TRADEMARK OFFICE
CERTIFICATE OF CORRECTION

PATENT NO.        : 7,834,482 B2                                        Page 1 of 1
APPLICATION NO.   : 11/739004
DATED             : November 16, 2010
INVENTOR(S)       : Fagg It is certified that error appears in the above-identified patent and that said Letters Patent is hereby corrected as shown below:

Column 19, line 36, claim 44: "the input;" to read as --an input;--

Column 20, line 10, claim 45: "the input;" to read as --an input;--

Column 20, line 26, claim 46: "the input;" to read as --an input;--

Signed and Sealed this
Fifth Day of July, 2011

David J. Kappos
*Director of the United States Patent and Trademark Office*